United States Patent [19]

Delfino et al.

[11] 4,415,794

[45] Nov. 15, 1983

[54] LASER SCANNING METHOD FOR ANNEALING, GLASS FLOW AND RELATED PROCESSES

[75] Inventors: Michelangelo Delfino, Mountain View; Timothy Reifsteck, Cupertino, both of Calif.

[73] Assignee: Fairchild Camera and Instrument Corporation, Mountain View, Calif.

[21] Appl. No.: 244,395

[22] Filed: Mar. 16, 1981

[51] Int. Cl.³ .............................................. B23K 27/00
[52] U.S. Cl. ...................... 219/121 LM; 219/121 LW
[58] Field of Search ...... 219/121 LM, 121 L, 121 LE, 219/121 LF, 121 LW, 121 LY, 121 EB, 121 EM, 121 EV

[56] References Cited

U.S. PATENT DOCUMENTS

| | | | |
|---|---|---|---|
| 3,900,737 | 8/1975 | Collier et al. | 219/121 EV X |
| 4,131,487 | 12/1978 | Pearce et al. | 219/121 LW X |
| 4,316,074 | 2/1982 | Daly | 219/121 LM X |

*Primary Examiner*—C. L. Albritton
*Attorney, Agent, or Firm*—Kenneth Olsen; Carl L. Silverman; Alan H. MacPherson

[57] ABSTRACT

A method for scanning the top surface of a semiconductor wafer prevents damage to the wafer (11) by ensuring that the laser beam (13) does not cross over the edge (11a) of the wafer during the scanning process nor approach within one (1) to two (2) millimeters to the edge of the wafer.

5 Claims, 7 Drawing Figures

LASER SCANNING METHOD FOR ANNEALING, GLASS FLOW AND RELATED PROCESSES

BACKGROUND OF THE INVENTION

1. Field of the Invention

This invention relates to laser scanning of semiconductor wafers for the purpose of either flowing glass, removing ion implant damage, electrically activating dopants from interstitial to substitutional positions or for increasing grain size of polycrystalline silicon and related activities, and more particularly to a method of using a laser for the purpose of scanning a semiconductor wafer which avoids the previously incurred damage to the wafer edge.

2. Description of the Prior Art

The laser scanning of semiconductor wafers for a variety of purposes, such as reflowing the glass found on the surface of the wafer, removing ion-implantation damage, electrically activating dopants from the interstitial to a substitutional position in the semiconductor material or increasing the grain size of polycrystalline silicon, to name a few, is becoming more widespread in the semiconductor industry. Typically, the wafer to be scanned is placed on a support structure called a "stage" fabricated using a reflective metal such as copper, aluminum, brass or a first metal coated with a reflective material such as gold or silver. The wafer is then mounted on the stage by means of a vacuum drawn through holes formed in the stage beneath the wafer and the combined structure is then subjected to the desired laser beam. A reflective metal is used for the stage so that the laser beam striking the stage is reflected thereby reducing the amount of heating of the stage and preventing the stage from melting. Materials which are not capable of reflecting most of the energy of the laser beam are not suitable for use as the stage. If the reflectivity of the stage is low, then the stage and the wafer on the stage both heat up due to the absorption of heat by the stage thereby changing the annealing parameters of the wafer.

Typically, a laser is scanned across the wafer surface using a raster scan technique. Either the stage containing the wafer or the beam is moved. The wafer is held on the stage by vacuum. Commonly, wafers subjected to laser scan are cracked and otherwise damaged at various points around the edges.

SUMMARY OF THE INVENTION

In accordance with this invention, the cracking and degradation of wafers caused by laser scanning is eliminated. We have discovered that the major cause of wafer degradation during laser scanning results from the nature of the scanning process. Typically, the beam is passed across the wafer over the interface between the wafer and the underlying stage. As the beam crosses the edge of the wafer, the heat within the wafer which previously had been dissipated by conduction in all directions is restricted to being dissipated substantially back into the wafer. The result is a substantial increase in the temperature of the wafer at the edge due to the impinging beam. This temperature increase strains the edge of the wafer due to thermal expansion of the heated material. This strain commonly chips or splits the heated material at the edge. While the rate at which the temperature increases is dependent upon a variety of factors including the rate of scan of the laser beam across the wafer surface, the thermal conductivity of the semiconductor material and any overlying materials on the surface of the semiconductor material, and the intensity of the laser beam, as well as the nature of the ambient in which the wafer is being scanned, the most likely result of the scanning of the beam over the edge of the wafer is to crack or otherwise degrade the edge. The degradation of the edge then propagates into the wafer, often destroying the wafer.

In accordance with our discovery, the method of our invention comprises changing the scan pattern so as to avoid passing the laser beam over the edge of the wafer. A typical beam is scanned either using a raster pattern or another pattern such as a series of congruent circles or a vector pattern corresponding to a desired result. In all of these patterns, however, in accordance with our invention the laser beam is carefully maintained a selected distance from the edge of the wafer. The amount of this distance varies with the thickness of the wafer and is typically on the order of 1 to 2 millimeters for a wafer of typical thickness of 0.5 millimeters. The closeness to which the edge can be approached depends also upon the intensity of the laser beam and the dwell time of the laser beam upon a particular region of semiconductor material.

This invention will be more fully understood in accordance with the following detailed description taken together with the attached drawings.

DETAILED DESCRIPTION OF THE INVENTION

Figure 1A:
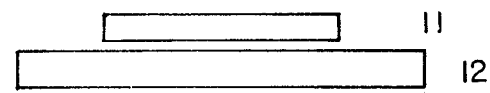
FIGS. 1a and 1b show a side view and an isometric view of a wafer to be laser scanned mounted on a stage.
Figure 1B:
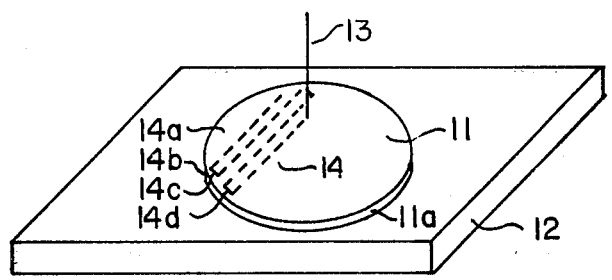
Figure 1C:
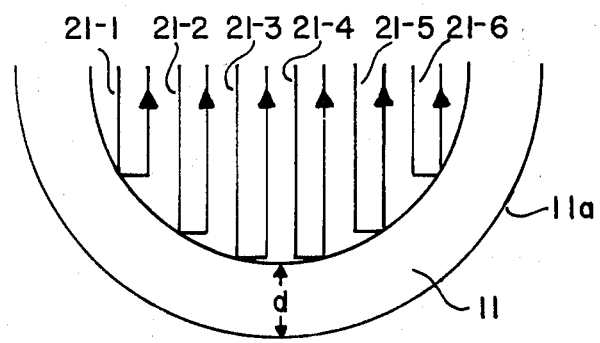
FIG. 1c illustrates a raster scan pattern in accordance with this invention wherein the scan pattern comes no closer than a fixed distance "d" from the edge of the wafer.
Figure 1D:
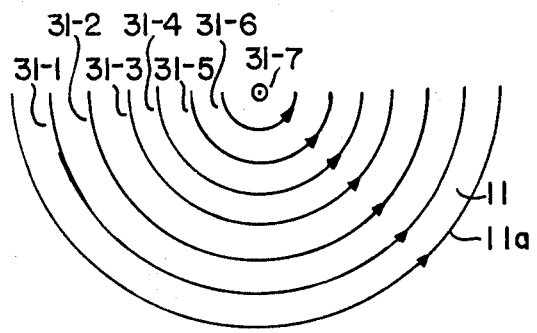
FIG. 1d illustrates an alternative scan pattern wherein the laser annealing beam is scanned over the wafer surface in concentric circles, the outermost circle being no greater than a selected distance from the edge of the wafer.
Figure 1E:
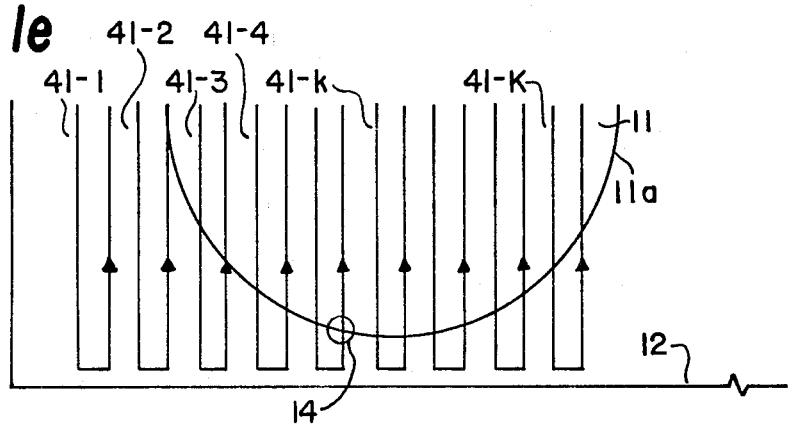
FIG. 1e illustrates the laser scan pattern of the prior art wherein the laser beam is scanned over the edge of the wafer.

FIG. 1e illustrates the prior art method of raster scanning a laser beam across a wafer surface. The laser beam intersection with the stage 12 upon which wafer 11 is mounted tracks out lines 41-1, 41-2, 41-3, 41-k through 41-K where K represents the number of raster scan lines formed by the intersection of the laser beam with stage 12 and wafer 11 and where k is an integer which varies from $1 < k < K$. Of inportance, raster scan line 41-k extends beyond the edge 11a of wafer 11 by an amount such that the raster scan lines taken together form a rectangular pattern across the surface of the combined wafer-stage structure.

Figure 1F:
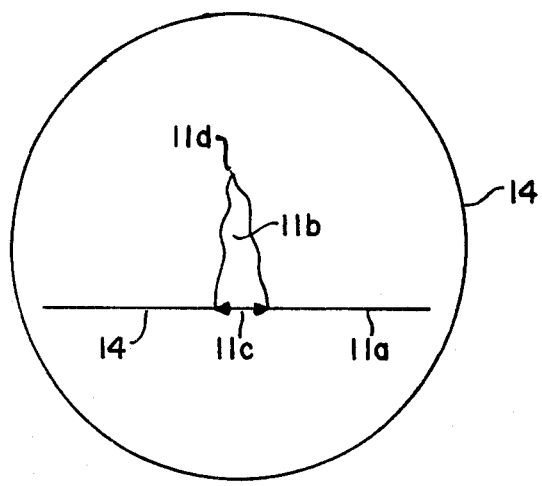
FIG. 1f shows the propagation of edge damage along the scan line over a portion of a wafer thereby cleaving the wafer along the scan line.

FIG. 1f shows the type of damage generated by this pattern at the edge 11a of wafer 11. FIG. 1f shows a blown-up portion 14 of the edge 11a of wafer 11. Portion 14 contains a wedge-shape crack 11b propagating inward from the edge 11a of wafer 11. The intersection 11c of crack 11b with edge 11a is relatively wide while the width of the crack reduces in size as the damage propagates inward to the center of the wafer. Portion 11d of the damage illustrates how the damage dissipates as it propagates through the wafer.

FIG. 1a illustrates in cross-section the mounting of wafer 11 on stage 12. Wafer 11 is held on stage 12 by vacuum drawn through holes (not shown) formed through stage 12.

FIGS. 1b, 1c and 1d illustrate the scan pattern of the invention wherein edge damage to the wafer is avoided. As illustrated in the isometric view of FIG. 1b, laser beam 13 is scanned in pattern 14 wherein the ends 14a, 14b, 14c and 14d of the raster scan pattern formed by the intersection of beam 13 with the surface of wafer 11 is maintained a selected distance "d" from the edge 11a of wafer 11 (FIG. 1c).

FIG. 1d illustrates a circular pattern formed by the intersection of beam 13 with the top surface of wafer 11. Each of the scan lines 31-1 through 31-6 is formed congruent with the other in circles of ever decreasing radius. Typically, although six such circles are shown for convenience, a plurality of 380 circles is formed on a 3" wafer and a plurality of 510 circles is formed on a 4" wafer. Each circle is spaced approximately 0.1 millimeters from the directly adjacent circles.

In one embodiment of this invention, a laser was scanned over the glass on top of the semiconductor wafer for the purpose of reflowing the glass. The laser was a 40 watt $CO_2$ gas laser operating continuous wave with a 200 micron diameter circular spot size. The scan speed was up to 2 centimeters per second. By avoiding the crossing of the edge of the wafer with the laser beam, the wafer so scanned emerged undamaged from the processing. In another test of this invention, an argon-ion laser manufactured by Spectra Physics, Inc. with a normal power rating of 15 watts continuous wave and a 40 micron spot size was operated at scan speeds up to 10 centimeters per second for the purpose of removing ion-implant damage. Again, by avoiding the crossing of the edge of the wafer, the wafer emerged undamaged from the processing.

Figure 1G:
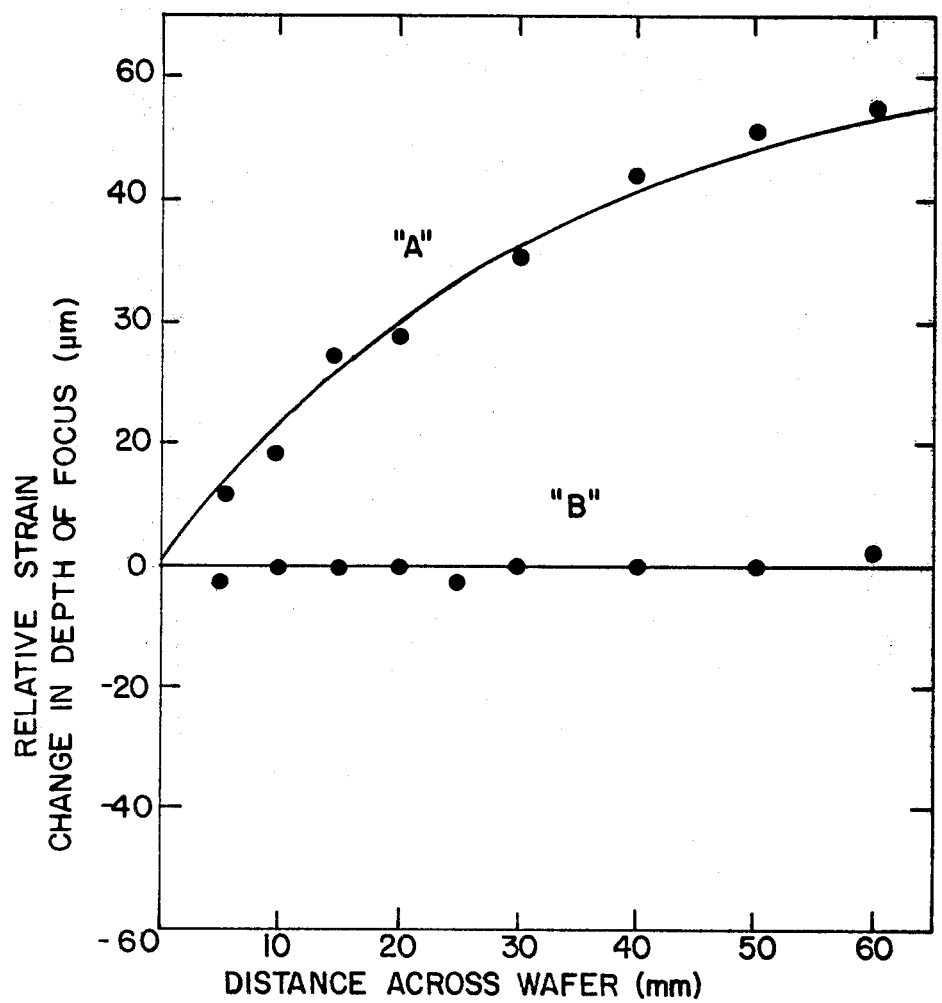
FIG. 1g shows the relationship between relative strain to distance on the top surface of wafers which have been laser annealed utilizing prior art methods and the unique method of this invention.

In a second embodiment of this invention, a p-type substrate having <100> orientation and a resistivity of approximately 5 to 9 ohm-cm was subjected to a 35 KeV boron implant at a dosage of $5 \times 10^{14}$ cm$^{-2}$. This boron implant formed a p+ region which simulates the doping of a substrate during normal device processing. Phosphosilicate glass (a phosphorus doped silicon oxide glass) was then deposited at 400° C. to a thickness of approximately 1.1 micron. This phosphosilicate glass was then laser annealed with an argon-ion laser utilizing a spot diameter of approximately 37 microns, a power level of 13 watts (multi-line) at a wavelength of approximately 0.5 micron, a scan speed of 2 cm/sec in the X direction, and 10 micron steps in the Y direction. The "A" type raster scan used crossed over the wafer edge at the interface between the wafer and the stage, as in the prior art laser annealing method. The "B" type raster scan of this invention did not cross over the wafer edge, and maintained a distance of at least 1 millimeter from the wafer edge. Test results showing the relative strain of wafers subjected to laser annealing utilizing the "A" type raster of the prior art, as compared with wafers annealed utilizing the "B" type raster scan of this invention, are shown in FIG. 1g. The abscissa of FIG. 1g shows the distance across the wafer, in millimeters. The ordinate of FIG. 1g shows a measure of the relative strain of the wafer. The relative strain of the wafer is measured utilizing well-known techniques for determining the distortion of the wafer, as is measured in microns by a microscopic technique showing the change in depth of focus in the distorted region. As can be seen from FIG. 1g, the wafer which has been laser annealed utilizing the technique of this invention shows virtually no relative strain. The wafer which has been laser annealed utilizing the raster scan of the prior art shows considerable relative strain, which results in a tensile stress of approximately $2.9 \times 10^9$ dynes/cm$^2$.

Experiments show that when using the principles of this invention to reflow phosphosilicate glass, bringing the laser beam closer than approximately 1.5 mm to the edge generally cracks the wafer. This phenomenon appears to be substantially independent of the thickness of the wafer but depends to some extent on the thickness of the glass being reflowed and the actual devices on the wafer. The devices on the wafer are believed to influence the amount of strain induced in the wafer by the laser-induced glass reflow. It has also been found that the higher the concentration of phosphorus in the phosphosilicate glass up to about 10% by weight, the closer the laser beam can go to the edge during the reflow operation. As the phosphorus content of the glass goes up, the stresses in the glass apparently are reduced. See the article entitled "CVD Glass Films for Passivation of Silicon Devices; Preparation, Composition, and Stress Properties", W. Kern, G. L. Schnable, and A. W. Fisher, RCA Rev. 37, 3 (1976).

Thus, utilizing the unique method of this invention, phosphosilicate glass formed on semiconductor wafers is laser annealed, while generating less strain on the surface of the wafer than in prior art techniques, thus resulting in substantially less damage to the wafer.

What is claimed is:

1. The method of laser scanning a semiconductor wafer which comprises the steps of:
   directing the beam from the laser across the top surface of the wafer in a selected pattern while at the same time preventing the laser beam from coming within a selected distance, d, of the edge of the wafer.

2. The method of claim 1 wherein d is about one (1) millimeter.

3. The method of claim 1 wherein said laser beam covers the top surface of the wafer but comes no closer than about one (1) to two (2) millimeters to the edge of the wafer.

4. The method of claim 1 wherein said laser beam is prevented from coming closer than about one and a half millimeters from the edge of the wafer.

5. The product produced by the method of claim 1, 2, 3 or 4.

* * * * *